United States Patent [19]

Black

[11] Patent Number: 5,264,800

[45] Date of Patent: Nov. 23, 1993

[54] MMIC TRANSIENT CAPTURE APPARATUS AND METHOD

[75] Inventor: Alistair D. Black, Los Gatos, Calif.

[73] Assignee: The Board of Trustees of the Leland Stanford, Jr. Univ., Stanford, Calif.

[21] Appl. No.: 946,037

[22] Filed: Sep. 15, 1992

Related U.S. Application Data

[63] Continuation of Ser. No. 731,984, Jul. 18, 1991, abandoned.

[51] Int. Cl.$^5$ ........................... H03K 5/22; H03K 5/26
[52] U.S. Cl. ............................. 328/109; 307/351; 307/353; 307/510; 307/516; 324/84; 328/65; 333/20
[58] Field of Search ................ 307/351, 234, 353, 510, 307/514, 516; 333/20; 328/109, 65; 324/77 H, 84; 342/153, 156

[56] References Cited

U.S. PATENT DOCUMENTS

| | | | |
|---|---|---|---|
| 3,023,966 | 3/1962 | Cox | 324/77 H |
| 3,093,798 | 6/1963 | Jacobsen | 328/65 |
| 3,311,822 | 3/1967 | Lorber | 324/77 H |
| 3,319,165 | 5/1967 | Hamlin | 324/84 |
| 3,519,851 | 7/1970 | Groner | 328/65 |
| 4,594,557 | 6/1986 | Shilladay . | |
| 4,855,696 | 8/1989 | Tan et al. | 333/20 |
| 5,014,018 | 5/1991 | Rodwell . | |
| 5,014,023 | 5/1991 | Mantele . | |

OTHER PUBLICATIONS

Williams: "Modern GaAs Processing Methods"—Artech—1990.
Ferry: "Gallium Arsenide Technology"—SAMS 1985.

Primary Examiner—John Zazworsky
Attorney, Agent, or Firm—Flehr, Hohbach, Test, Albritton & Herbert

[57] ABSTRACT

A Monolithic Microwave Integrated Circuit (MMIC) for capturing transients in the GHz range is disclosed. The device includes a transmission line formed in a GaAs substrate. The transmission line includes a number of threshold devices forming shunts on the transmission line. The threshold devices are positioned at predetermined locations with respect to one another. A reference signal and an unknown signal are counter-propagated along the transmission line. When the two signals collide, they produce a collision voltage which exceeds the threshold voltage of the threshold devices. The voltage information is distributed along the predetermined length of several threshold devices. Thus, amplitude, phase, and timing information regarding the two signals may be obtained. This information may be utilized for triggering, clock interpolation, data demodulation, and other applications.

17 Claims, 6 Drawing Sheets

MMIC TRANSIENT CAPTURE APPARATUS AND METHOD

This is a continuation of application Ser. No. 07/731,984 filed Jul. 18, 1991, now abandoned.

BRIEF DESCRIPTION OF THE INVENTION

This invention relates to a novel phase detector. More particularly, this invention relates to a Monolithic Microwave Integrated Circuit which includes a transmission line with a number of diode taps which are used to capture a collision event on the transmission line between a reference pulse and an input pulse and thereby analyze properties of the two signals.

BACKGROUND OF THE INVENTION

A number of approaches are currently available for analyzing high frequency transient input signals. One approach is to use a ramp generator. The input signal is used to trigger a ramp generator which generates a ramp of a known dv/dt. By sampling the voltage on the ramp at some later time, a calculation can be made to determine how much time has passed since the ramp was triggered. Particularly, by utilizing a well controlled current source, and a known capacitance, the equation ic=dv/dt can be used to provide timing information on the signal.

Flip flops may also be used to analyze high speed transient signals. In this method, a clock signal goes into the clock input of a D flip flop while the input signal goes into the data input of the flip flop. The flip flops are placed along a transmission line, so that the data will sequentially show up in the flip flops. Consequently, clocking signals take a flash view of the incoming signal. Signal characteristics can be derived from this information.

Another approach to analyzing high frequency input signals is steady state mixing with a clock or local oscillator signal. This function is similar to a phase detector in a phase locked loop. This technique only works for periodic signals.

Each of these prior art approaches has one or more disadvantages associated with it. Flip flops are inherently slow, thus they do not represent a practical tool for analyzing high speed signals. Utilization of a ramp generator is also problematic because it is necessary to trigger the ramp generator and then read its output in a sequential fashion. Thus, ramp generators are also slow.

Current high frequency input signal analysis devices are made in silicon and are either lumped circuits or hybrid tapped delay lines. The lumped circuits have limited throughput because the output is serial, while the hybrid approach has limited resolution because of large parasitic effects due to connections from the chip and the external transmission line. In addition, since silicon is a conductive substrate, signal losses along an integrated silicon transmission line make the development of an integrated silicon tapped line delay structure difficult. Consequently, present transient phase detector devices are limited to about 10 ps resolution with a throughput of approximately 100 KHz for oscilloscopes and 200 ps at 20 MHz for time interval measurement instruments.

There are current attempts to produce distributed monolithic silicon devices using active delay elements to achieve the effect of a tapped delay line. This approach is problematic given the non-uniformities and instabilities associated with active delay elements.

OBJECTS AND SUMMARY OF THE INVENTION

It is a general object of the present invention to provide a monolithic microwave integrated circuit transient capture apparatus and method.

It is a more particular object of the present invention to provide a plurality of transmission line taps which can be utilized to provide distributed information of a collision event.

It is another object of the present invention to provide a detector consisting of passive components which reduce random noise and have higher stability.

It is another object of the present invention to provide a detector with approximately sub-picosecond resolution.

It is still another object of the present invention to provide a phase detector with a throughput above 500 MHz.

These and other objects are achieved by a Monolithic Microwave Integrated Circuit for capturing transients in the GHz range. The device includes a transmission line formed in a GaAs substrate. The transmission line includes a number of threshold devices forming shunts on the transmission line. The threshold devices are positioned at predetermined locations with respect to one another. A reference signal and an unknown signal are counter-propagated along the transmission line. When the two signals collide, they produce a collision voltage which exceeds the threshold voltage of the threshold devices. The voltage information is distributed along the predetermined length of several threshold devices. Thus, amplitude, phase, and timing information regarding the two signals may be obtained. This information may be utilized for triggering, clock interpolation, data demodulation, and other applications.

BRIEF DESCRIPTION OF THE DRAWINGS

Other objects and advantages of the invention will become apparent upon reading the following detailed description and upon reference to the drawings, in which.

DETAILED DESCRIPTION OF THE INVENTION

Figure 1:
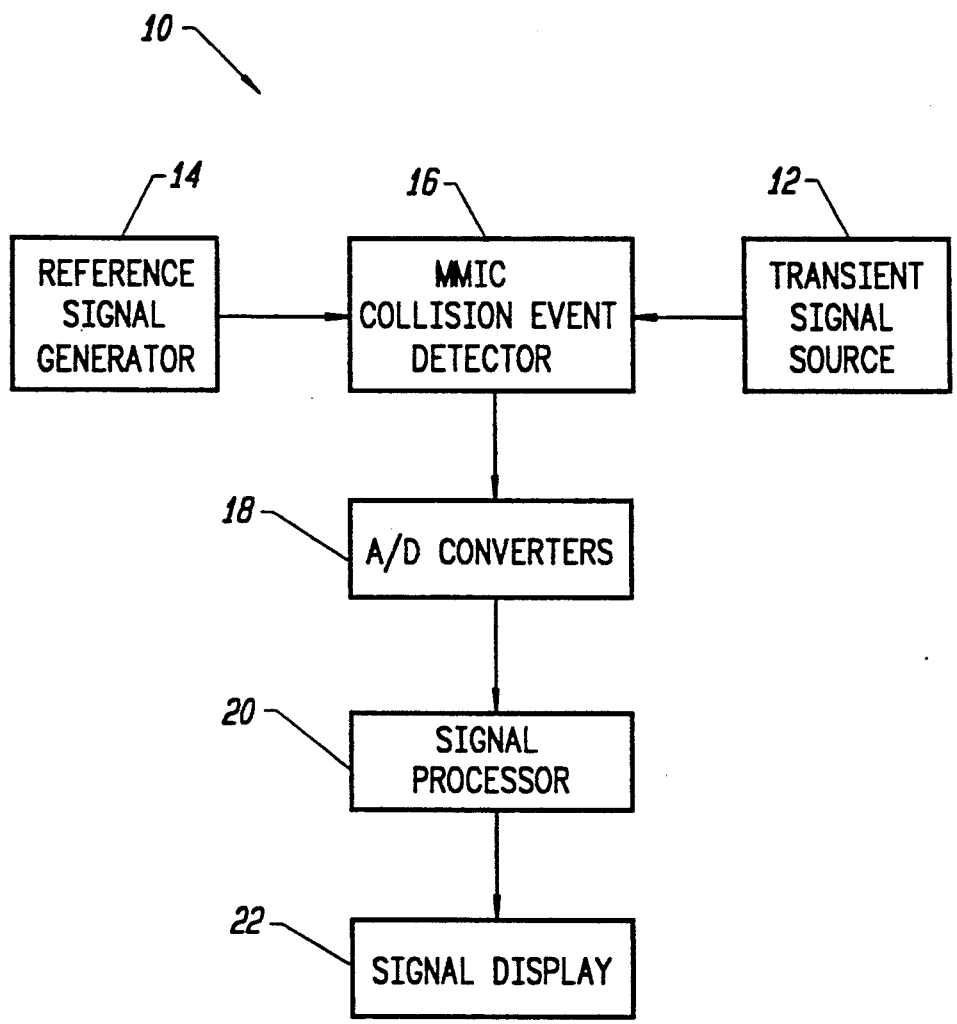
FIG. 1 is a block diagram of components which may be used in accordance with the present invention.

Turning now to the drawings, wherein like components are designated by like reference numerals in the various figures, attention is initially directed to FIG. 1 which depicts a monolithic microwave integrated circuit (MMIC) capture apparatus 10, in accordance with the present invention. The capture apparatus 10 includes a transient signal source 12 which generates an unknown signal. The signal source 12 may be any signal which is to be captured or otherwise analyzed. The capture apparatus 10 also includes a reference signal generator 14 which produces a known periodic signal.

The signal source 12 and signal generator 14 propagate their respective signals to a MMIC phase detector 16. As to be more fully described herein, the MMIC phase detector 16 includes a GaAs substrate with a transmission line formed on the substrate. A plurality of nonlinear threshold devices, such as diodes, are in a shunted configuration along the length of the transmission line. The threshold devices act as peak detectors; that is, the threshold devices have a threshold voltage which is exceeded only when the counterprogating signals from the signal source 12 and reference signal generator 14 collide. The distributed threshold devices are coupled to hold capacitors which store the voltage information. Thus, the distributed components provide multiple samples of the collision event. From these samples, high resolution amplitude, phase, and timing information can be derived from a single input pulse. Indeed, with the present invention, sub-picosecond resolution is possible. In addition, a throughput of over 500 MHz is possible with the present invention.

The outputs of the threshold devices are preferably conveyed to an A/D converter 18. The resultant digital information can then be processed by a prior art signal processor 20 in a digital format. The processed signal from the signal processor 20 may then be conveyed to a signal display 22, such as an oscilloscope, to provide visual information regarding the collision event.

Figure 2:
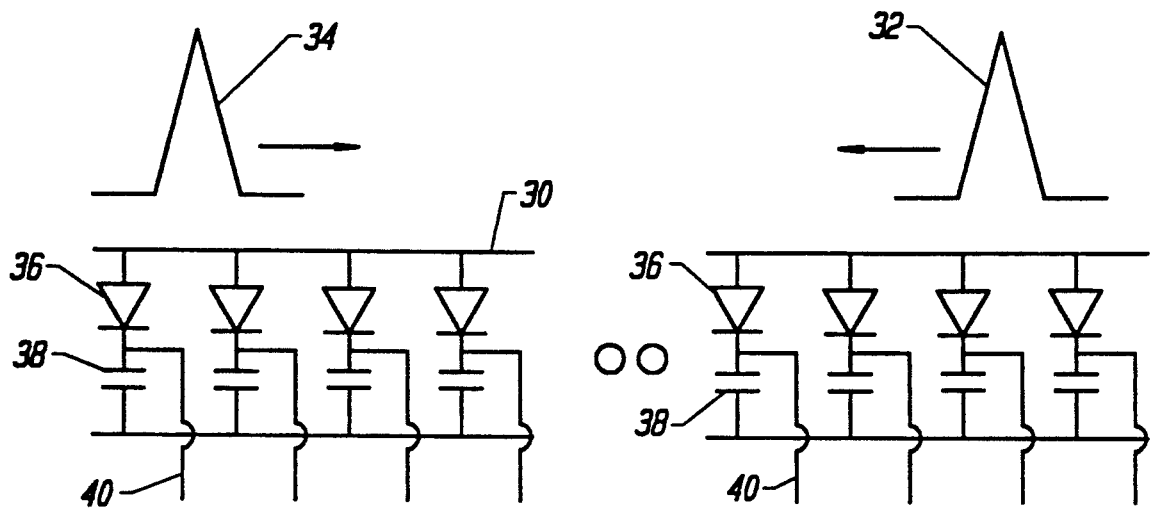
FIG. 2 is a schematic representation of a suitable transient capture device which may be utilized in accordance with the present invention.

Turning to FIG. 2, a schematic representation of the MMIC phase detector 16 of the present invention is disclosed. A transmission line 30 formed in a GaAs substrate receives a signal 32 from signal source 12 and a reference signal 34 from reference signal generator 14. The two signals are counter-propagated on the transmission line 30. Threshold devices 36 are positioned along the length of the transmission line 30. The threshold devices 36 may be diodes formed in the GaAs substrate, as to be more fully described herein. The diodes 36 are biased such that their threshold is exceeded only upon the collision of the two signals.

Figure 3:
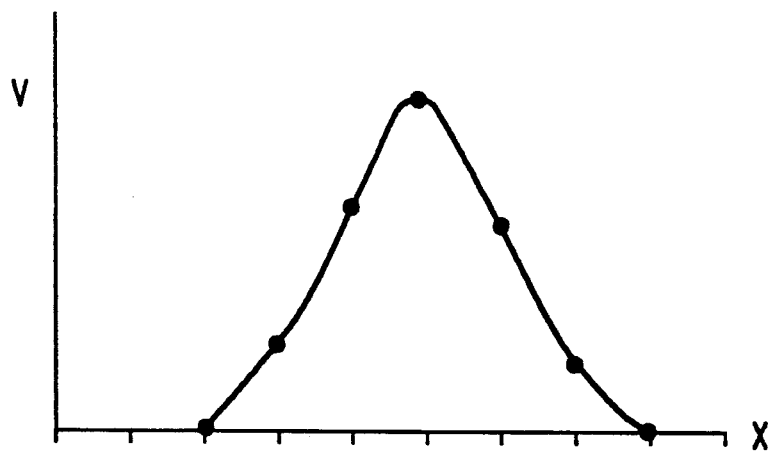
FIG. 3 depicts an exemplary waveform created after the collision of an input signal and reference signal.

As the signals collide, they provide distributed information in relation to the collision event. This feature is more fully appreciated in reference to FIG. 3. FIG. 3 depicts a representative depiction of a collision event as a function of position along the transmission line and voltage. As can be appreciated, the vertical axis, corresponding to voltage values, will provide data defining the amplitude and shape of the input signal. The horizontal axis will provide timing information since timing can be related to position along the line by the signal velocity, a well known constant. More particularly, since the frequency of the reference signal 34 is known, and the spacing of the diodes 36 is predetermined, the location of the collision event may be used to determine the timing of the input signal 32.

Prior art techniques are utilized to interpolate the information between each diode 36. For instance, silicon comparators and digital processing techniques may be utilized to provide a linear fit of the digitized information.

Returning to FIG. 2, each diode 36 is preferably coupled to a hold capacitor 38. An output line is positioned between each diode 36 and each capacitor 38. The output line 40 reads the charge information from the hold capacitor 38 after the collision event is recorded on the capacitors 38.

In an alternate embodiment of the present invention, the diode and capacitor 36 and 38 may be replaced by another non-linear device. A FET could be used as a square law device in a configuration similar to a distributed amplifier, except the inputs would be propagating in both directions. This embodiment would have a lower transmission line bandwidth due to the FET devices.

The output lines 40 are preferably coupled to an A/D converter 18, which is known in the art. The A/D converter 18 allows for digital signal processing. Naturally, analog signal processing may be utilized if desirable for the particular application.

The transmission line 30, diodes 36, capacitors 38, and output lines 40 are formed in GaAs. The output may be processed by GaAs MESFETS integrated on the same die. With MESFET signal processing, the throughput, or sample processing rate, can be greater than 500 MHz. As the GaAs circuit is monolithic, small spacing between diodes 36 may be used to get finer resolution. The many distributed diodes 36 may then be utilized for parallel processing of the output.

While an integrated GaAs device is extremely fast, the expense associated with this approach may be prohibitive. It may be desirable to process the output with a silicon processing chip placed next to the MMIC and connected by wire bonds or by a high density packaging technique such as Tape Automated Bonding. While the data processing elements may not be formed in GaAs and thus will not have the same speed as the GaAs elements, the parallel nature of the output will enable parallel processing of the data and efficient data processing techniques such a pipelining may be employed.

The output from the A/D converter 18 is preferably conveyed to signal processor 20. Signal processor 20 is preferably in the form of digital hardware and firmware, but software may be utilized in the absence of strict time requirements. The processed signal 20 is then preferably conveyed to a signal display 22. The processed signal may also be conveyed to a computer controller.

As will be appreciated by one skilled in the art, the method and apparatus of the present invention may be utilized in a number of applications. For instance, the present invention may be used as a trigger in a high speed oscilloscope. Instead of altering the clock to match the input signal or delaying the clock to match the input signal, with the present invention, the relationship between the clock and the input signal are immediately established.

The method and apparatus of the present invention may also be utilized in demodulating high frequency signals. In particular, since multiple samples are obtained for each clock pulse, a lower frequency clock can be used to demodulate the data. In addition, since the data is coming out in parallel, parallel processing techniques are available to enhance the processing speed.

The method and apparatus of the present invention may also be utilized for phase detection. Prior art phase detectors generally utilize a single diode to take samples at the zero crossing of two signals, with the output voltage being proportional to the phase between the signals. As can be appreciated, with the present invention, an improved system is realized since one obtains several outputs which are related at known phases.

Having disclosed the principles of the invention and some of its applications, attention presently turns to details associated with the fabrication of a device in accordance with the invention. MMIC processes to fabricate transmission lines, diodes, and capacitors are well-known in the art.

Figure 4:
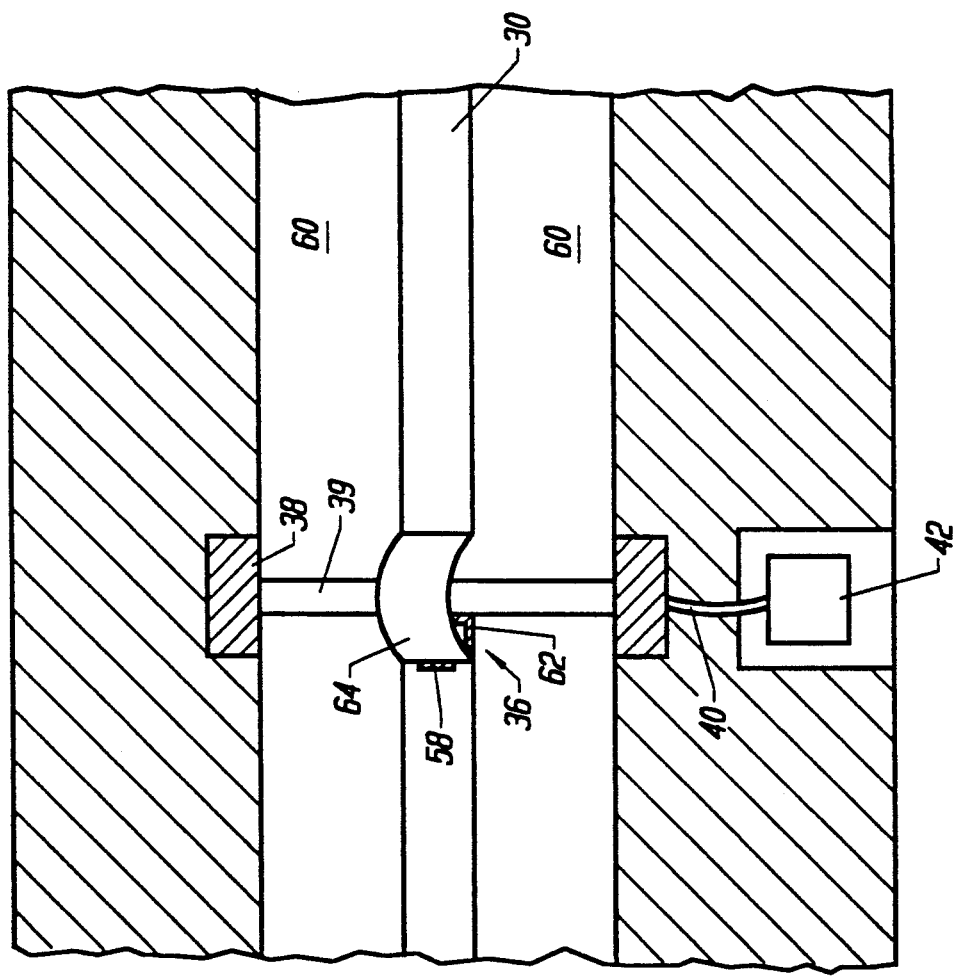
FIG. 4 is a perspective view of an air bridge formed in conjunction with a transmission line of a monolithic microwave integrated circuit, in accordance with the present invention.

Turning to FIG. 4, a perspective view of a MMIC with a transmission line 30 is depicted. The transmission line 30 is coupled to a Schottky diode 36, as to be more fully described herein. The diode 36 is coupled to a metal-insulator-metal capacitor 38 by metal lead 39. Output line 40 is coupled to output line 42.

Figure 5:
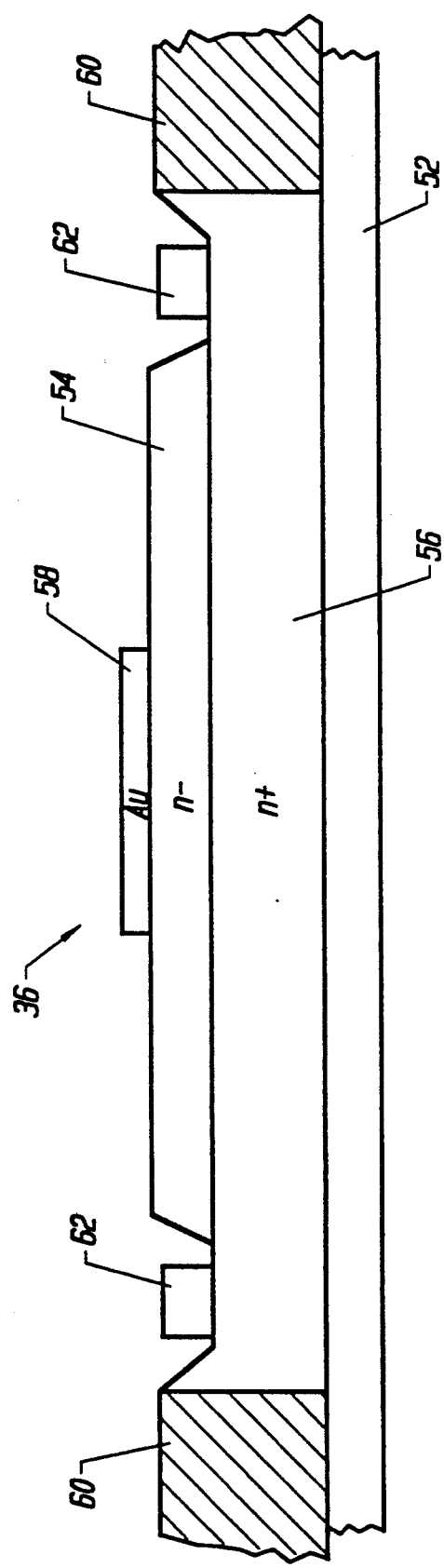
FIG. 5 is a cross-sectional view of a diode formed in accordance with the present invention.

Turning to FIG. 5, a Schottky diode 36 is formed on gallium arsenide molecular beam epitaxy material 52 with a 0.3 micrometer N− active layer 54 which has $3 \times 10^{16}$ per cubic centimeter doping. A buried 0.8 micrometer N+ layer 56 has a $3 \times 10^{18}$ per cubic centimeter doping. A 1.3 micrometer gold layer 58 provides the Schottky contact. The diode 36 is isolated by proton implant regions 60.

Ohmic contacts 62 with a 0.02 ohm-millimeter resistivity are formed by a 0.75 micrometer recess edge. The Ohmic contacts 62 are self-aligned gold/germanium/nickel/gold lift-off, and a 450° C. alloy.

Proton implantation regions 60 are formed by using both 110 keV implant at a dose of $7 \times 10^{14}$ per square centimeter and a 190 keV implant of a dose of $1 \times 10^{15}$ per square centimeter. This proton implant damages the substrates sufficiently to provide greater than 40 Megohm per square with insulation. During implantation, a 1.6 micrometer gold mask on top of a 1.4 micrometer polyimide layer protects the ohmic contacts on the diode active region. The interconnections are formed with a 0.1 micrometer titanium/0.75 micrometer-platinum/1.4 micrometer gold lift-off.

Capacitors are fabricated by depositing 1000 angstroms of 250° C. PECVD silicon nitride over the entire wafer and reactive ion etching holes, in a $C_2F_6$ plasma, where contact is to be made to underlying metal. The bottom plate of the capacitor is the Schottky metal lead 39 while the top plate is 2 micrometers of plated gold.

The last element required for the device is an air bridge 64, which is depicted in FIG. 4. The air bridge 64, which is a cross-over with no supporting dielectric, can be made to clear the metal lead 39 by 1.5 micrometers. This gap, in addition to the unity dielectric constant of air, gives the air bridge cross-over extremely low capacitive coupling to the metalization below.

Returning to FIG. 4, it can be seen that Schottky contact 58 is coupled to air bridge 64 and ohmic contact 62 is coupled to metal lead 39. Metal lead 39 is coupled to capacitor 38.

Figure 6:
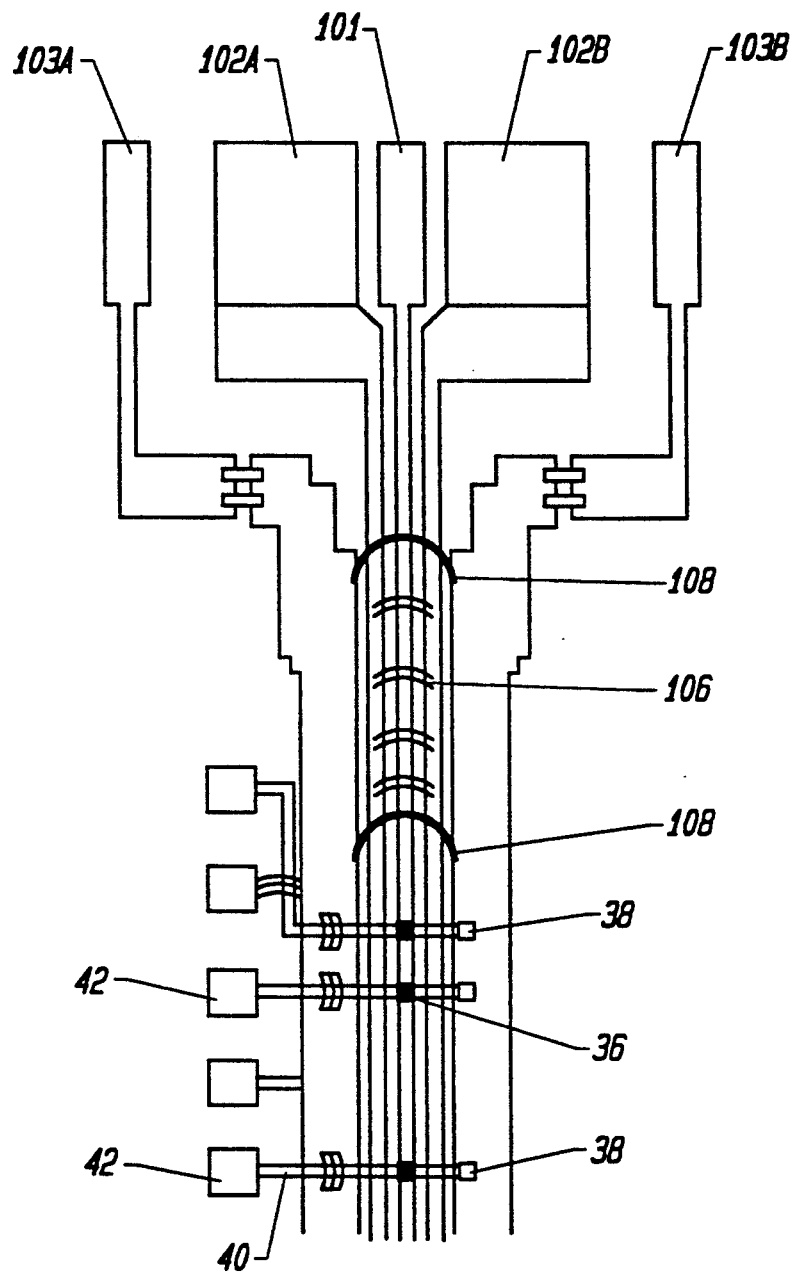
FIG. 6 is a plan view of an alternate embodiment of a monolithic microwave integrated circuit formed in accordance with the present invention.
Figure 7:
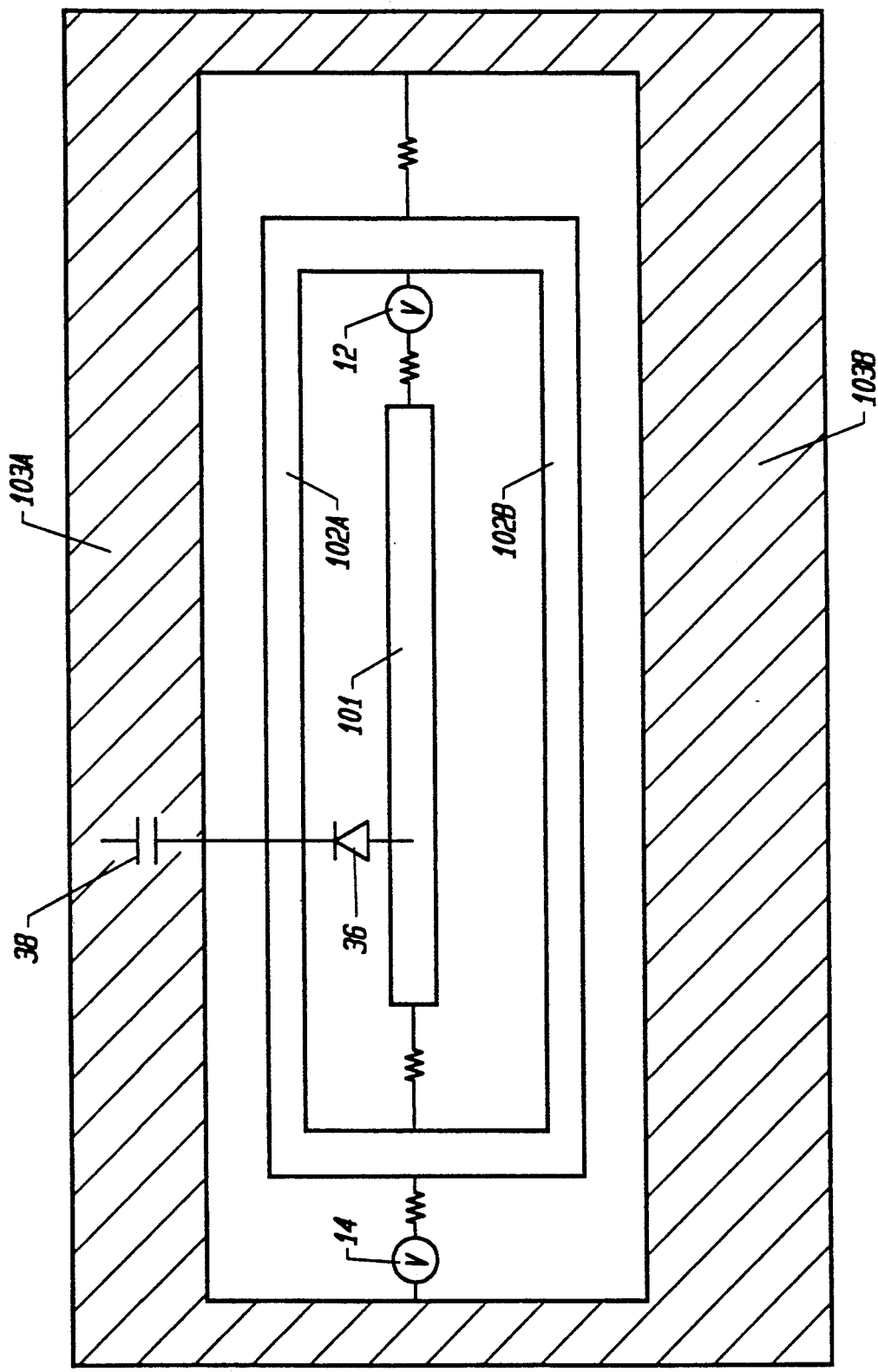
FIG. 7 is a simplified view of the monolithic microwave integrated circuit of FIG. 6.

Turning to FIGS. 6 and 7, another embodiment of the present invention is depicted. Nested transmission lines are depicted. The first line consists of conductor 101 in combination with 102A and 102B; the second line consists of 102A and 102B in combination with 103A and 103B. Signal source 12 in accordance with conductor 101 represents the positive lead on the first line while lines 102A and 102B in combination are negative. Signal generator 14 in accordance with lines 102A and 102B form the positive lead of the second line with lines 103A and 103B in combination being negative.

In this configuration, the two lines are utilized in series such that isolation is achieved between the two inputs (12 and 14) but the interaction of the counter-propagating waves is essentially the same. This embodiment takes advantage of the unique waveguide structure that essentially results in a transmission line inside a transmission line, such that the two lines are isolated—the outer conductor of the first line (102A and 102B) forms the inner conductor of the second line (102A and 102B in combination with 103A and 103B). The diodes 36 are then connected between the inner conductor of the first line (101) and the outer conductor of the second line (103A and 103B).

This structure gives up half the voltage on the hold capacitors 38 due to increased output impedance seen by the diodes 36. However, since the two inputs (12 and 14) are no longer directly connected, there is isolation between them. Straps 106 in FIG. 6 couple lines 102A and 102B. Similarly, straps 108 couple lines 103A and 103B.

Another embodiment of the present invention is also feasible where a very high bandwidth is not required (less than 50 GHz). In this case, a synthetic transmission line may be employed using discrete inductors and capacitors to form a periodic L-C-L-C-L-C . . . structure. This type of structure will behave like a transmission line at low frequencies compared to its LC resonance. This embodiment can also be fabricated through most MMIC processes known in the art. Finally, this embodiment requires much less space for the transmission line on the MMIC, compared to a conventional coplanar waveguide or microstrip.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A collision event detector comprising:
   a semi-conducting substrate;
   a transmission line formed on said substrate;
   means for transmitting an input signal and a reference signal in opposite directions along said transmission line; and
   a multiplicity of detector devices, coupled to said transmission line at a sequence of spaced-apart tap points along said transmission line, that generate a corresponding multiplicity of output signals when said input signal and said reference signal are counter-propagated along said transmission line, each output signal indicating whether collision of said signals occurred at a corresponding one of said tap points along said transmission line.

2. The apparatus of claim 1 wherein each detector device includes a diode coupled to a hold capacitor, said diode conducting a voltage on said hold capacitor when said counter-propagated signals generate an interaction voltage at a corresponding one of said tap points along said transmission line such that said interaction voltage exceeds a predefined threshold;

each of said multiplicity of output signals comprising the voltage stored on said hold capacitor of a corresponding one of said detector devices.

3. The collision event detector of claim 1, wherein said multiplicity of detector devices each include a hold capacitor for storing a voltage generated by said counter-propagating signals at a corresponding one of said tap points along said transmission line.

4. The collision event detector of claim 1, wherein said multiplicity of detector devices each include a non-linear device coupled to a hold capacitor, said non-linear device conducting a voltage on said hold capacitor in accordance with a voltage generated by said counter-propagating signals at a corresponding one of said tap points along said transmission line;

each of said multiplicity of output signals comprising the voltage stored on said hold capacitor of a corresponding one of said detector devices.

5. The apparatus of claim 4 wherein said semi-conducting substrate is GaAs.

6. The apparatus of claim 4, wherein said transmission line includes an air bridge positioned over a metallic lead coupled to one of said multiplicity of detector devices.

7. The apparatus of claim 6 further comprising an additional transmission line connected in series with said transmission line to form a nested transmission line configuration.

8. The collision event detector of claim 4, wherein said transmitting means transmits said reference signal at times determined with respect to a reference time base;

said collision event detector including:
a signal processor, coupled to said multiplicity of detector devices, that receives said multiplicity of output signals and determines based on said output signals when said input signal was transmitted, relative to said reference time base.

9. A collision event detector comprising:
a semi-conducting substrate;
a transmission line formed on said substrate, said transmission line having first and second end points;
a reference signal generator, coupled to said transmission line's first end point, that generates a time reference signal for propagation along said transmission line from said first end point to said second end point;
a signal source, coupled to said transmission line's second end point, that transmits a second signal for counter-propagation along said transmission line with respect to said time reference signal; and
a multiplicity of detector devices, coupled to said transmission line at a sequence of spaced-apart tap points along said transmission line, that generate a corresponding multiplicity of output signals when said time reference signal and said second signal intersect, each output signal indicating whether said intersection of signals formed an interaction voltage exceeding a predefined threshold at a corresponding one of said tap points along said transmission line.

10. The collision event detector of claim 9, wherein said multiplicity of detector devices are non-linear devices.

11. The collision event detector of claim 9, wherein said multiplicity of detector devices each include a hold capacitor for storing a voltage generated by said counter-propagating signals at a corresponding one of said tap points along said transmission line.

12. The collision event detector of claim 9, wherein said multiplicity of detector devices each include a non-linear device coupled to a hold capacitor, said non-linear device storing a voltage on said hold capacitor in accordance with a voltage generated by said counter-propagating signals at a corresponding one of said tap points along said transmission line;

each of said multiplicity of output signals comprising the voltage stored on said hold capacitor of a corresponding one of said detector devices.

13. The apparatus of claim 12 wherein said semiconducting substrate is GaAs.

14. The apparatus of claim 12 wherein said transmission line includes an air bridge positioned over a metallic lead coupled to one of said multiplicity of detector devices.

15. The apparatus of claim 12 further comprising an additional transmission line connected in series with said transmission line thereby forming a nested transmission line configuration.

16. The collision event detector of claim 12, further including
a signal processor, coupled to said multiplicity of detector devices, that receives said multiplicity of output signals and determines the amplitude of said second signal based on the voltages stored in said detector devices.

17. The collision event detector of claim 12 wherein said reference signal generator generates said time reference signal at times determined with respect to a reference time base;

said collision event detector including:
a signal processor, coupled to said multiplicity of detector devices, that receives said multiplicity of output signals and determines based on said output signals when said second signal was transmitted, relative to said reference time base.

* * * * *